US 11,342,891 B2

(12) United States Patent
Watanabe et al.

(10) Patent No.: US 11,342,891 B2
(45) Date of Patent: May 24, 2022

(54) AMPLIFIER CIRCUIT

(71) Applicant: Murata Manufacturing Co., Ltd., Kyoto (JP)

(72) Inventors: Daisuke Watanabe, Kyoto (JP); Nobuyasu Beppu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 39 days.

(21) Appl. No.: 17/098,826

(22) Filed: Nov. 16, 2020

(65) Prior Publication Data

US 2021/0067104 A1 Mar. 4, 2021

Related U.S. Application Data

(63) Continuation of application No. PCT/JP2019/019303, filed on May 15, 2019.

(30) Foreign Application Priority Data

May 17, 2018 (JP) .............................. JP2018-095710

(51) Int. Cl.
*H03F 1/22* (2006.01)
*H03F 1/56* (2006.01)
*H03F 1/02* (2006.01)
*H03F 3/193* (2006.01)

(52) U.S. Cl.
CPC ............. *H03F 1/56* (2013.01); *H03F 1/0205* (2013.01); *H03F 3/193* (2013.01); *H03F 2200/222* (2013.01)

(58) Field of Classification Search
CPC ........................................................ H03F 1/22

USPC .................................................. 330/311, 310
See application file for complete search history.

(56) References Cited

U.S. PATENT DOCUMENTS

| | | | |
|---|---|---|---|
| 7,696,828 B2 * | 4/2010 | Chang | H03F 1/223 330/311 |
| 10,965,256 B2 * | 3/2021 | Seshita | H03F 3/195 |
| 11,201,594 B2 * | 12/2021 | Beppu | H03F 3/195 |
| 2007/0296507 A1 | 12/2007 | Hamaguchi | |

(Continued)

FOREIGN PATENT DOCUMENTS

| JP | 2008005160 A | 1/2008 |
|---|---|---|
| JP | 2009010826 A | 1/2009 |

(Continued)

OTHER PUBLICATIONS

International Search Report issued in Application No. PCT/JP2019/019303, dated Aug. 13, 2019.

(Continued)

*Primary Examiner* — Henry Choe
(74) *Attorney, Agent, or Firm* — Pearne & Gordon LLP

(57) ABSTRACT

An amplifier circuit (1) includes a FET (10) having a source terminal (S1), a drain terminal (D1), and a gate terminal (G1), a FET (20) having a source terminal (S2), a drain terminal (D2), and a gate terminal (G2) and coupled in parallel with the FET (10), a FET (30) having a source terminal (S3) coupled to the drain terminals (D1 and D2), a drain terminal (D3), and a gate terminal (G3) and cascoded with the FETs (10 and 20), and feedback circuits (21 and 22) configured to feed back to the gate terminal (G2) a high frequency signal outputted from the source terminal (S2) or the drain terminal (D2).

13 Claims, 10 Drawing Sheets

(56) References Cited

U.S. PATENT DOCUMENTS

| | | | |
|---|---|---|---|
| 2009/0174481 A1 | 7/2009 | Chang | |
| 2012/0235246 A1 | 9/2012 | Abe et al. | |
| 2016/0112018 A1 | 4/2016 | Scuderi et al. | |
| 2018/0123523 A1 | 5/2018 | Vujcic et al. | |

FOREIGN PATENT DOCUMENTS

| | | |
|---|---|---|
| JP | 2011509048 A | 3/2011 |
| JP | 2013236410 A | 11/2013 |
| JP | 2017531407 A | 10/2017 |
| WO | 2011039792 A1 | 4/2011 |
| WO | 2017190764 A1 | 11/2017 |

OTHER PUBLICATIONS

Written Opinion issued in Application No. PCT/JP2019/019303, dated Aug. 13, 2019.

\* cited by examiner

FET10 SIDE PATH

FET20 SIDE PATH

AMPLIFIER CIRCUIT

CROSS REFERENCE TO RELATED APPLICATIONS

This is a continuation of International Application No. PCT/JP2019/019303 filed on May 15, 2019 which claims priority from Japanese Patent Application No. 2018-095710 filed on May 17, 2018. The contents of these applications are incorporated herein by reference in their entireties.

BACKGROUND

Technical Field

The present disclosure relates to a cascode-connected amplifier circuit.

Amplifier circuits for high frequency signals used in mobile communication devices are required to have an excellent amplification characteristic and an excellent noise characteristic over a wide dynamic range.

Patent Document 1 discloses an amplifier circuit in which two transistors are cascoded between an input terminal and an output terminal. By cascoding two transistors, the Miller effect is reduced and the frequency characteristic of the amplifier circuit is improved.

Patent Document 2 discloses a semiconductor device in which two amplifier circuits are coupled in parallel between an input terminal and an output terminal for the purpose of implementing various amplification modes. More specifically, the gate width of a transistor included in one of the two amplifier circuits and the gate width of a transistor included in the other amplifier circuit are made different from each other.

Patent Document 1: Japanese Unexamined Patent Application Publication No. 2008-5160

Patent Document 2: International Publication No. 2011/039792

BRIEF SUMMARY

For example, the cascode-connected transistors described in Patent Document 1 are used separately in two amplifier circuits coupled in parallel to each other as the semiconductor device described in Patent Document 2. Specifically, a cascode-connected transistor of a larger gate width is used in one amplifier circuit and a cascode-connected transistor of a smaller gate width is used in the other amplifier circuit. With this configuration, the two transistors of different gate widths are caused to operate in an exclusive manner in accordance with the intensity of high frequency input power, and as a result, it is possible to implement a semiconductor device that accomplishes both improvement of the amplification characteristic and noise characteristic and reduction in current consumption over a wide dynamic range and that also achieves an excellent frequency characteristic.

However, the combination of the configuration disclosed in Patent Document 1 and the semiconductor device disclosed in Patent Document 2 results in an insufficient distortion characteristic of high frequency signals especially with respect to the transistor of a smaller gate width. Furthermore, since the input/output impedance fluctuates due to the exclusive operations performed by the two transistors of different gate widths, it is difficult to achieve impedance matching with external circuits.

The present disclosure provides a cascode-connected amplifier circuit with which an improved distortion characteristic and improved impedance matching can be achieved.

An amplifier circuit according to an aspect of the present disclosure includes an input terminal to which a high frequency signal is inputted, an output terminal configured to output the high frequency signal amplified, a first transistor including a first source terminal, a first drain terminal, and a first gate terminal to which the high frequency signal is inputted via the input terminal, a second transistor including a second source terminal, a second drain terminal, and a second gate terminal to which the high frequency signal is inputted via the input terminal, the second transistor being coupled in parallel with the first transistor, a third transistor including a third source terminal coupled to at least either the first drain terminal or the second drain terminal, a third drain terminal configured to output the high frequency signal amplified, and a third gate terminal grounded, the third transistor being cascoded with at least either the first transistor or the second transistor, and one or more feedback circuits configured to feed back to the second gate terminal the high frequency signal outputted from the second source terminal or the second drain terminal. When the gate width of the first transistor is W1, the gate length of the first transistor is L1, the gate width of the second transistor is W2, and the gate length of the second transistor is L2, W2/L2 is smaller than W1/L1.

The present disclosure can provide a cascode-connected amplifier circuit with which an improved distortion characteristic and improved impedance matching can be achieved.

DETAILED DESCRIPTION

Figure 1A:
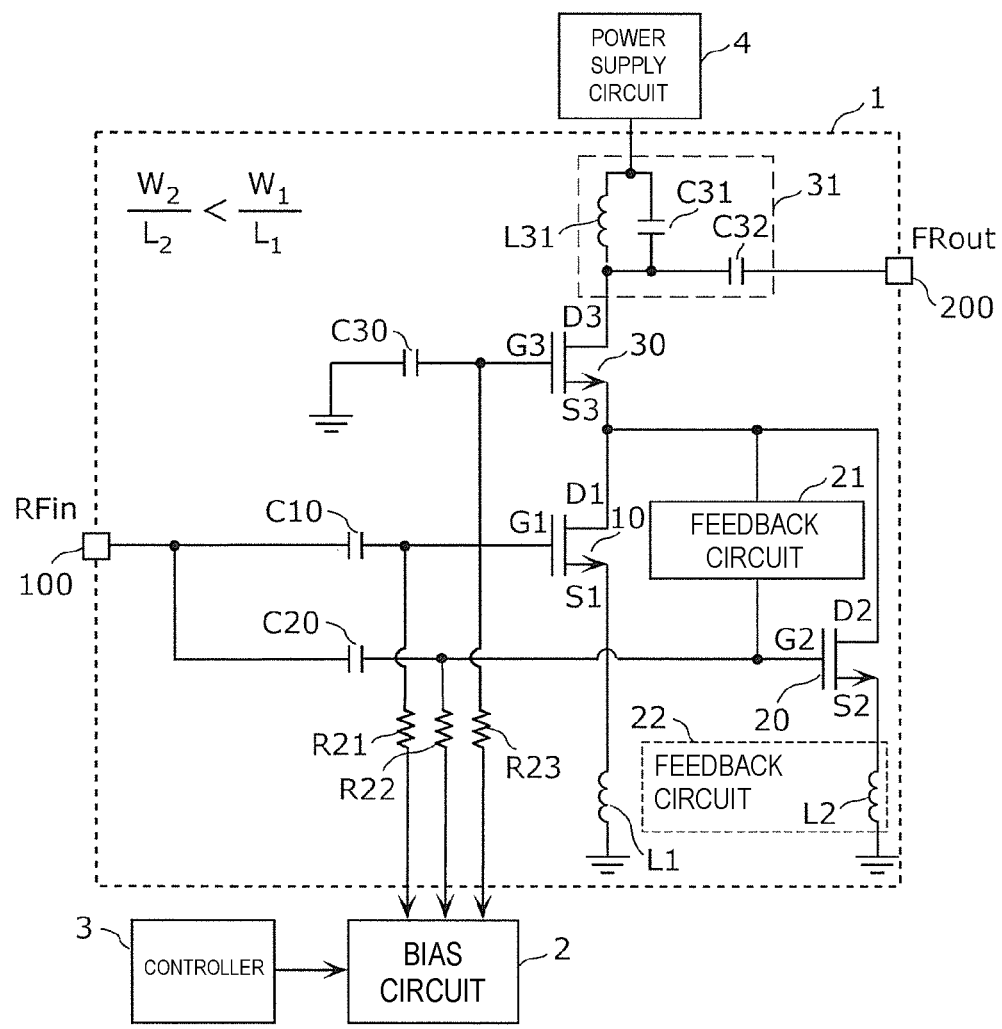
FIG. 1A is a circuit configuration diagram of an amplifier circuit according to an embodiment and peripheral circuits.

Hereinafter, embodiments of the present disclosure will be described in detail with reference to the drawings. It should be noted that the embodiments described below are all specific or comprehensive instances. The numerical values, the shapes, the materials, the constituent elements, the arrangements of the constituent elements, and the modes of connection, and the like given in the following embodiments are mere instances and are not intended to limit the present disclosure. Among the constituent elements in the following embodiments, constituent elements not recited in any of the independent claims are described as arbitrary constituent elements. Furthermore, the size or the size ratio of the constituent elements illustrated in the drawings is not necessarily presented in an exact manner.

EMBODIMENT

[1.1 Configuration of Amplifier Circuit According to Embodiment]

FIG. 1A is a circuit configuration diagram of an amplifier circuit 1 according to an embodiment and peripheral circuits. In the drawing, the amplifier circuit 1 according to the present embodiment, a bias circuit 2, a controller 3, and a power supply circuit 4 are illustrated.

The power supply circuit 4 supplies a drive voltage to drain terminals of FETs 10, 20 and 30 that form the amplifier circuit 1.

The bias circuit 2 supplies a direct current (DC) bias voltage to gate terminals of the FETs 10, 20 and 30 that form the amplifier circuit 1.

The controller 3 controls the bias circuit 2 and outputs to the bias circuit 2 a control signal for adjusting the DC bias voltage supplied to the amplifier circuit 1 in accordance with the power intensity of the high frequency signal inputted to the amplifier circuit 1.

The amplifier circuit 1 includes an input terminal 100, an output terminal 200, the FETs 10, 20, and 30, and feedback circuits 21 and 22.

The FET 10 is a first transistor including a source terminal S1 (first source terminal), a drain terminal D1 (first drain terminal), and a gate terminal G1 (first gate terminal) and is an n-type field-effect transistor in the present embodiment. The gate terminal G1 of the FET 10 is coupled to the input terminal 100 via a capacitor C10. A high frequency signal is inputted to the gate terminal G1 of the FET 10 via the input terminal 100. The source terminal S1 of the FET 10 is grounded via an inductor L1.

The FET 20 is a second transistor including a source terminal S2 (second source terminal), a drain terminal D2 (second drain terminal), and a gate terminal G2 (second gate terminal), and is an n-type field-effect transistor in the present embodiment. The gate terminal G2 of the FET 20 is coupled to the input terminal 100 via a capacitor C20. A high frequency signal is inputted to the gate terminal G2 via the input terminal 100. The source terminal S2 of the FET 20 is grounded via an inductor L2.

The FET 30 is a third transistor including a source terminal S3 (third source terminal), a drain terminal D3 (third drain terminal), and a gate terminal G3 (third gate terminal), and is an n-type field-effect transistor in the present embodiment.

The FETs 10 and 20 are coupled in parallel with each other. Specifically, both the source terminal S1 of the FET 10 and the source terminal S2 of the FET 20 are grounded and the drain terminal D1 of the FET 10 is coupled to the drain terminal D2 of the FET 20.

The source terminal S3 of the FET 30 is coupled to the drain terminal D1 of the FET 10 and the drain terminal D2 of the FET 20. The drain terminal D3 of the FET 30 is coupled to the output terminal 200 via an output matching circuit. The gate terminal G3 of the FET 30 is grounded via a capacitor C30. This means that the gate terminal G3 of the FET 30 is grounded with respect to high frequency signals.

With the connection configuration described above, the FET 30 is cascoded with the FET 10 and also cascoded with the FET 20.

It should be noted that the FETs 10, 20, and 30 may be p-type field-effect transistors.

The feedback circuit 21 is a circuit that feeds back a high frequency signal outputted from the drain terminal D2 of the FET 20 to the gate terminal G2 of the FET 20.

The feedback circuit 22 is a feedback circuit that subjects, by changing the potential of the source terminal S2 of the FET 20, a voltage (VGS) across the gate terminal G2 and the source terminal S2 of the FET 20 to feedback, or performs feedback from the source terminal S2 to the gate terminal G2.

This means that the feedback circuits 21 and 22 are one or more feedback circuits that feed back to the gate terminal G2 a high frequency signal outputted from the source terminal S2 or the drain terminal D2.

Here, the gate width of the FET 10 is W1 and the gate length of the FET 10 is L1. The gate width of the FET 20 is W2 and the gate length of the FET 20 is L2. In this case, Expression 1 indicated below is satisfied with regard to the amplifier circuit 1 according to the present embodiment.

$$\frac{W_2}{L_2} < \frac{W_1}{L_1} \qquad \text{(Expression 1)}$$

According to the relationship given by Expression 1, (1) when the power intensity of high-frequency input signal is relatively low, the amplifier circuit 1 according to the present embodiment operates in a high-gain and low-noise-figure mode in which a high-frequency input signal flows through the FET 10 and the noise figure is optimized; by contrast, (2) when the power intensity of high-frequency input signal is relatively high, the amplifier circuit 1 according to the present embodiment operates in a low-current and low-distortion mode (indicating an excellent distortion characteristic) in which a high-frequency input signal flows through the FET 20.

Specifically, when the power intensity of high-frequency input signal is relatively low, the bias circuit 2 supplies an optimized DC bias voltage to the gate terminal G1 of the FET 10 and the gate terminal G3 of the FET 30 in accordance with a control signal outputted by the controller 3. When the power intensity of high-frequency input signal is relatively high, the bias circuit 2 supplies an optimized DC bias voltage to the gate terminal G2 of the FET 20 and the gate terminal G3 of the FET 30 in accordance with a control signal outputted by the controller 3. As a result, the FETs 10 and 20 perform amplification operation in an exclusive manner in accordance with the power intensity of high-frequency input signal.

Usually, in an amplifier circuit that amplifies high frequency signals, in accordance with the power intensity of receive signal, one mode is selected in many cases from the following two modes: (1) the high-gain and low-noise-figure mode in which the noise figure is optimized and that is used when the receive signal is weak and (2) the low-current and low-distortion mode (indicating an excellent distortion characteristic) that is used when the receive signal is relatively strong. Accordingly, it is assumed that the two modes are implemented by selecting one transistor in an exclusive manner between two kinds of transistors having different characteristics. However, in the case in which transistors of a small LW ratio (W/L) are used, although the low-current and low-distortion mode is implemented to some extent, the distortion characteristic is insufficient in particular frequency ranges used in the amplifier circuit; and as a result, a perfectly low distortion characteristic cannot be achieved. Alternatively, in the case in which two kinds of transistors of different LW ratios (W/L) are used by switching to implement the two modes, since the input impedances are different from each other when the FETs are used, impedance mismatching occurs on input terminal sides of the FETs 10 and 20.

By contrast, in the above-described configuration of the amplifier circuit 1 according to the present embodiment, when the gate width of transistor is W and the gate length is L, the feedback circuit 21 or 22 is positioned between the input and the output (that is, between the gate and the source or between the gate and the drain) of the FET 20 of a small LW ratio (W/L), and thus, input impedance matching of the FETs 10 and 20 can be achieved and the distortion characteristic can also be improved. In addition, the FETs 10 and 20 are arranged in parallel on the input terminal 100 side while the FET 30 is commonly coupled to the FETs 10 and 20 on the output terminal 200 side. This makes it possible to match the output impedance of a signal path in which the FETs 10 and 30 are cascoded and the output impedance of a signal path in which the FETs 20 and 30 are cascoded.

It should be noted that the amplifier circuit 1 according to the present embodiment only needs to include at least either the feedback circuit 21 or 22. Effects of the feedback circuits 21 and 22 will be described later.

Figure 1B:
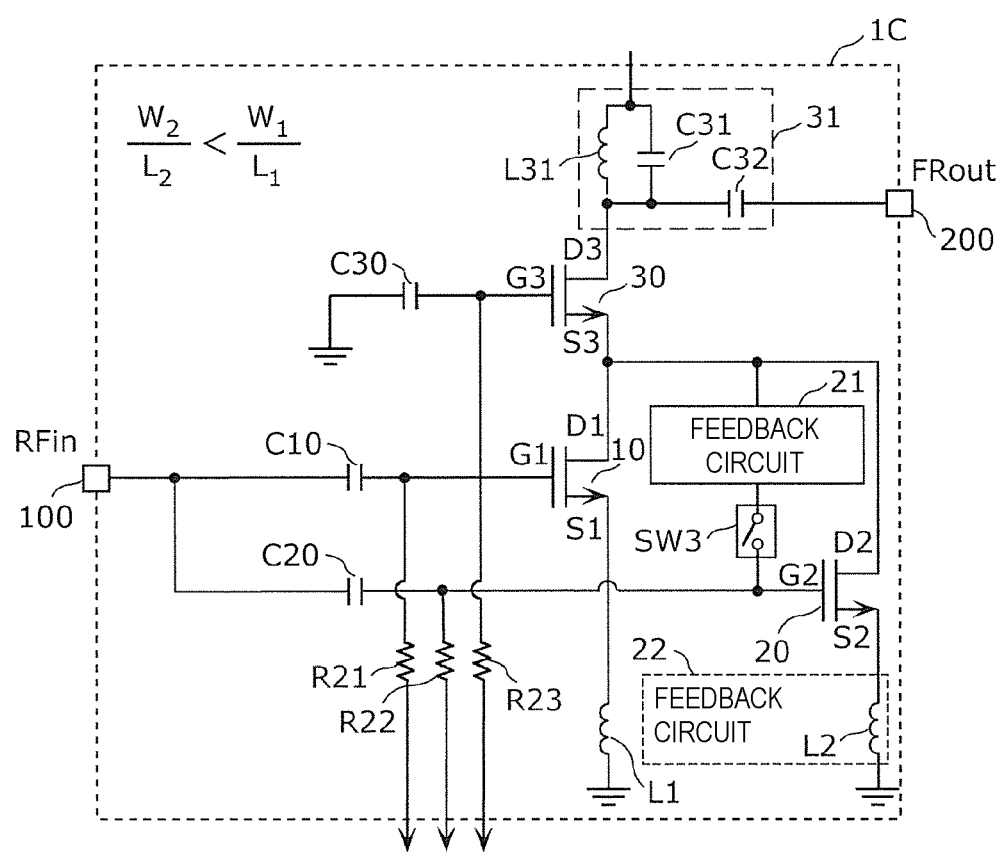
FIG. 1B is a circuit configuration diagram of an amplifier circuit according to a first modified example of the embodiment.

The connection between the feedback circuit 21 and the gate terminal G2 of the FET 20 may be changed by a switch. FIG. 1B is a circuit configuration diagram of an amplifier circuit 1C according to a first modified example of the embodiment. With respect to the amplifier circuit 1, the amplifier circuit 1C according to this modified example further includes a switch SW3 coupled in series between the feedback circuit 21 and the gate terminal G2 of the FET 20. As illustrated in FIG. 1B, the switch SW3 is coupled in series between the feedback circuit 21 and the gate terminal G2 of the FET 20. In the case in which the FET 20 performs amplification operation (the low-current and low-distortion mode), the switch SW3 is in a connected state (ON) and connects the feedback circuit 21 to the gate terminal G2 of the FET 20. In the case in which the FET 10 performs amplification operation (the high-gain and low-noise-figure mode), the switch SW3 is in a disconnected state (OFF) and disconnects the feedback circuit 21 from the gate terminal G2 of the FET 20. With this configuration, in the case in which the FET 10 performs amplification operation, it is possible to suppress degradation of the noise figure of the FET 10 which may happen if the noise due to the feedback circuit 21 flows into the FET 10. Therefore, it is possible to maintain a low noise figure required for the high-gain and low-noise-figure mode.

Referring back to FIG. 1A, the amplifier circuit 1 and its peripheral circuits will be described. The amplifier circuit 1 further includes the inductor L1, the capacitors C10, C20, and C30, resistance elements R21, R22, and R23, and an output matching circuit 31.

The inductor L1 is a first inductor having one end coupled to the source terminal S1 of the FET 10 and the other end coupled to the ground.

The inductor L2 is a second inductor constituting the feedback circuit 22 and having one end coupled to the source terminal S2 of the FET 20 and the other end coupled to the ground.

With the connection configuration described above, the inductors L1 and L2 are inductors having a source degeneration function and suppress a rise in the gate-source voltage by raising the source potential relative to the ground with respect to increase of the drain-source current. As a result, increase of the drain-source current can be suppressed, so that, for example, the third-order intermodulation distortion can be reduced. This means that the inductors L1 and L2 each functions as a feedback circuit for the FET 10 or 20 by feeding back a high frequency signal (the potential at the source terminal due to the high-frequency signal) outputted from the source terminal with respect to the gate-source voltage to improve the distortion characteristic.

Here, the inductance value of the inductor L2 may be larger than the inductance value of the inductor L1. As a result, the amount of feedback from the source terminal S2 to the gate terminal G2 of the FET 20 can be increased, so that the third-order intermodulation distortion can be reduced and the distortion characteristic can be further improved. This means that the distortion characteristic of the FET 20 of a small LW ratio (W/L) can be improved so as to achieve a further lower-distortion mode. As a result, the amplifier circuit 1 can more reliably implement the low-current and low-distortion mode used when the receive signal is relatively strong. By setting the inductance value of the inductor coupled to the source terminal to a large value, the distortion characteristic is improved, whereas the gain is reduced. In this regard, in the FET 10 that is required to achieve a higher gain than that of the FET 20, the inductance value of the inductor L1 is set to a relatively small value to suppress improvement of the distortion characteristic, and as a result, the gain degradation of the FET 10 can be suppressed.

The capacitor C10 is a first capacitor positioned in series between the input terminal 100 and the gate terminal G1. The capacitor C10 has a function of blocking passage of a DC component between the input terminal 100 and the FET 10 and also functions as an element for matching of the input impedance of the FET 10.

The capacitor C20 is a second capacitor positioned in series between the input terminal 100 and the gate terminal G2. The capacitor C20 has a function of blocking passage of a DC component between the input terminal 100 and the FET 20 and also functions as an element for matching of the input impedance of the FET 20.

The capacitor C30 is positioned in series between the ground and the gate terminal G3. The capacitor C30 has a function of blocking passage of a DC component between the FET 30 and the ground.

The resistance element R21 is positioned in series between the bias circuit 2 and the gate terminal G1 of the FET 10. The resistance element R22 is positioned in series between the bias circuit 2 and the gate terminal G2 of the FET 20. The resistance element R23 is positioned in series between the bias circuit 2 and the gate terminal G3 of the FET 30. The resistance elements R21, R22, and R23 have a function of applying to the respective FETs 10, 20, and 30 a bias DC current outputted from the bias circuit 2 as a bias DC voltage.

The output matching circuit 31 includes an inductor L31 and capacitors C31 and C32. A circuit in which the inductor L31 and the capacitor C31 are coupled in parallel to each other is positioned in series between the power supply circuit 4 and the drain terminal D3 of the FET 30. The capacitor C32 is positioned in series between the drain terminal D3 of the FET 30 and the output terminal 200. With this configuration, the output matching circuit 31 has a function of blocking passage of a DC component between the FET 30 and the output terminal 200 and a function of adjusting the output impedance of the amplifier circuit 1.

[1.2 Configuration of Amplifier Circuit According to Practical Example]

Figure 2:
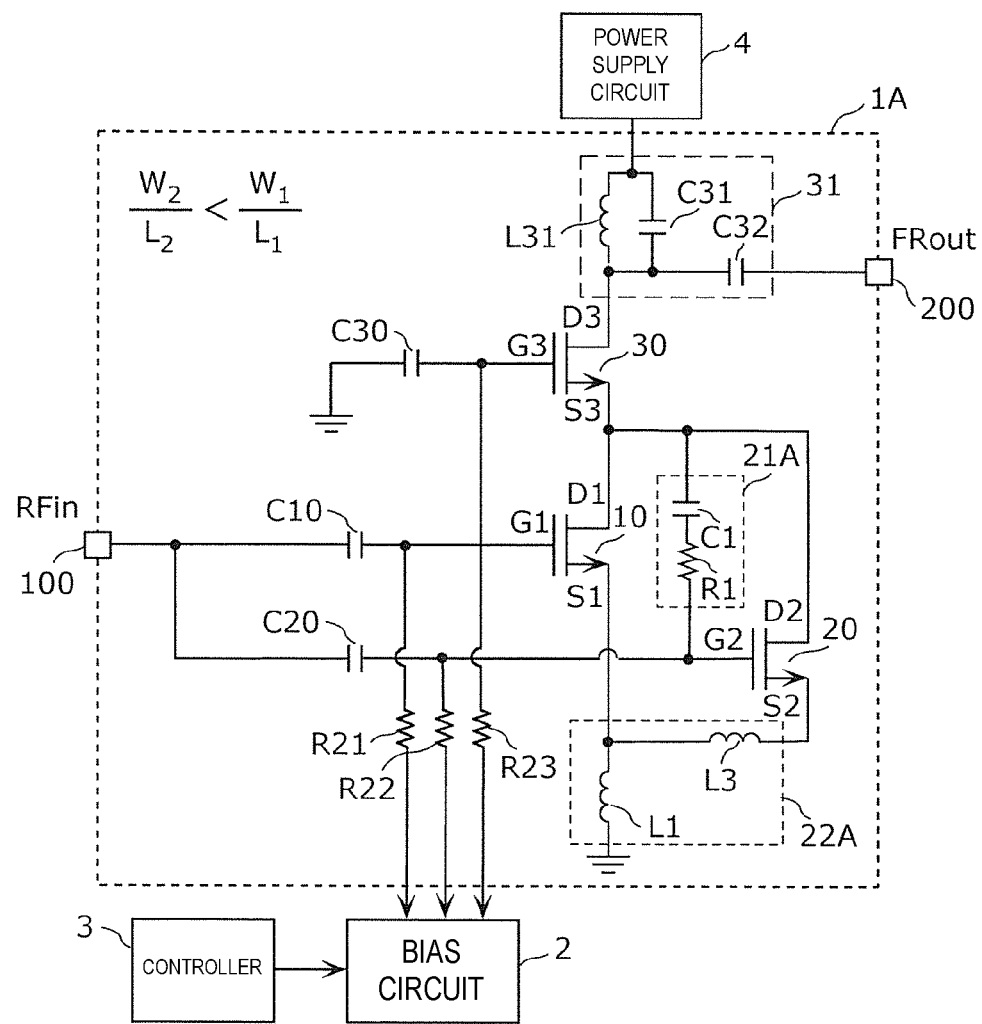
FIG. 2 is a circuit configuration diagram of an amplifier circuit according to a practical example and peripheral circuits.

FIG. 2 is a circuit configuration diagram of an amplifier circuit 1A according to a practical example and peripheral circuits. In the drawing, the amplifier circuit 1A according to the practical example, the bias circuit 2, the controller 3, and the power supply circuit 4 are illustrated. The amplifier circuit 1A according to the practical example differs from the amplifier circuit 1 according to the embodiment in that, instead of the feedback circuits 21 and 22, feedback circuits 21A and 22A, which are specific circuit configurations of the feedback circuits 21 and 22, are added. Hereinafter, concerning the amplifier circuit 1A according to the practical example, description of configurations identical to the configurations of the amplifier circuit 1 according to the embodiment is omitted and different configurations are mainly described.

The amplifier circuit 1A includes an input terminal 100, an output terminal 200, the FETs 10, 20, and 30, and feedback circuits 21A and 22A. The amplifier circuit 1A further includes the capacitors C10, C20, and C30, the resistance elements R21, R22, and R23, and the output matching circuit 31.

The feedback circuit 21A is a circuit for feeding back to the gate terminal G2 of the FET 20 a high frequency signal outputted from the drain terminal D2 of the FET 20 and includes a capacitor C1 and a resistance element R1. The capacitor C1 and the resistance element R1 are coupled in series to each other to form a circuit; one end of the circuit is coupled to the drain terminal D2 of the FET 20 and the other end is coupled to the gate terminal G2 of the FET 20. This means that the feedback circuit 21A is formed as a CR series circuit.

The feedback circuit 22A is a circuit that feeds back a high frequency signal (the potential at the source terminal S2 due to the high frequency signal) outputted from the source terminal S2 of the FET 20 with respect to the gate-source voltage across the FET 20 and includes inductors L1 and L3. The inductor L1 is a first inductor having one end coupled to the source terminal S1 of the FET 10 and the other end coupled to the ground. The inductor L3 is a third inductor having one end coupled to the source terminal S1 of the FET 10 and the other end coupled to the source terminal S2 of the FET 20. With this configuration, one end of the circuit in which the inductors L1 and L3 are coupled in series with each other is coupled to the source terminal S2 of the FET 20 and the other end of the circuit is coupled to the ground. This means that the inductor L2 in the feedback circuit 22 according to the embodiment is composed of the inductors L1 and L3 in the feedback circuit 22A according to the practical example.

According to the configurations of the inductors coupled to the sources in the amplifier circuit 1A according to the practical example, the inductor (L1+L3) coupled to the source of the FET 20 includes the inductor L1 coupled to the source of the FET 10, and as a result, it is possible to reduce the area in which the inductors coupled to the sources are formed and contribute to downsizing of the amplifier circuit 1A.

Next, the principle that input impedance matching of the FETs 10 and 20 can be achieved with an improved distortion characteristic of the FET 20 by using the feedback circuits 21A and 22A will be described.

[1.3 Improvement of Distortion Characteristic]

When a feedback path is provided between the input end (gate terminal) and the output end (drain terminal) of a FET amplifier element, a harmonic contained in an output signal from the FET amplifier element with the feedback path is reduced in comparison to a harmonic contained in an output signal from a FET amplifier element without necessarily a feedback path. Specifically, the third-order intercept point (IIP3) of the FET amplifier element for which the feedback path is provided is obtained by multiplying the IIP3 of the FET amplifier element without necessarily a feedback path by $$(1 + A\beta)^{\frac{3}{2}} \qquad \text{(Expression 2)}$$

where A is the gain of a FET amplifier element and β is the feedback amount.

In the amplifier circuit 1A according to the practical example, the inductor L1 coupled to the source terminal S1 is an inductor having a source degeneration function and suppress a rise in the gate-source voltage by raising the source potential relative to the ground with respect to a rise in the drain-source current. As a result, increase in the drain-source current is suppressed. The inductor L1 is a circuit that feeds back a high frequency signal (the potential at the source terminal S1 due to the high frequency signal) outputted from the source terminal S1 of the FET 10 with respect to the gate-source voltage across the FET 10. In the FET 10, as the inductance value of the inductor L1 increases, the amount of suppression of a rise in the gate-source voltage due to the inductor L1, which is a feedback amount β10L, increases.

Also, the inductor (L1+L3) coupled to the source terminal S2 is an inductor having a source degeneration function and suppress a rise in the gate-source voltage by raising the source potential relative to the ground with respect to a rise in the drain-source current. As a result, increase in the drain-source current is suppressed. The inductor (L1+L3) is a circuit that feeds back a high frequency signal (the potential at the source terminal S2 due to the high frequency signal) outputted from the source terminal S2 of the FET 20 with respect to the gate-source voltage across the FET 20. In the FET 20, as the inductance value of the inductor (L1+L3) increases, the amount of suppression of a rise in the gate-source voltage due to the inductor (L1+L3), which is a feedback amount β20L, increases.

Further, since the feedback circuit 21A is additionally coupled to the FET 20, a feedback amount β21 due to the feedback circuit 21A is added to the FET 20.

Accordingly, the feedback amount (β20L+β21) of the FET 20 is larger than the feedback amount (β10L) of the FET 10. Thus, the IIP3 of the FET 20 is higher than the IIP3 of the FET 10, and as a result, it is possible to reduce the third-order intermodulation distortion with respect to the FET 20, which is required to implement the low-current and low-distortion mode while the FET 10 is required to implement the high-gain and low-noise-figure mode, so that the distortion characteristic of the FET 20 can be improved. As a result, the amplifier circuit 1A can more reliably implement the low-current and low-distortion mode used when the receive signal is relatively strong.

Figure 3A:
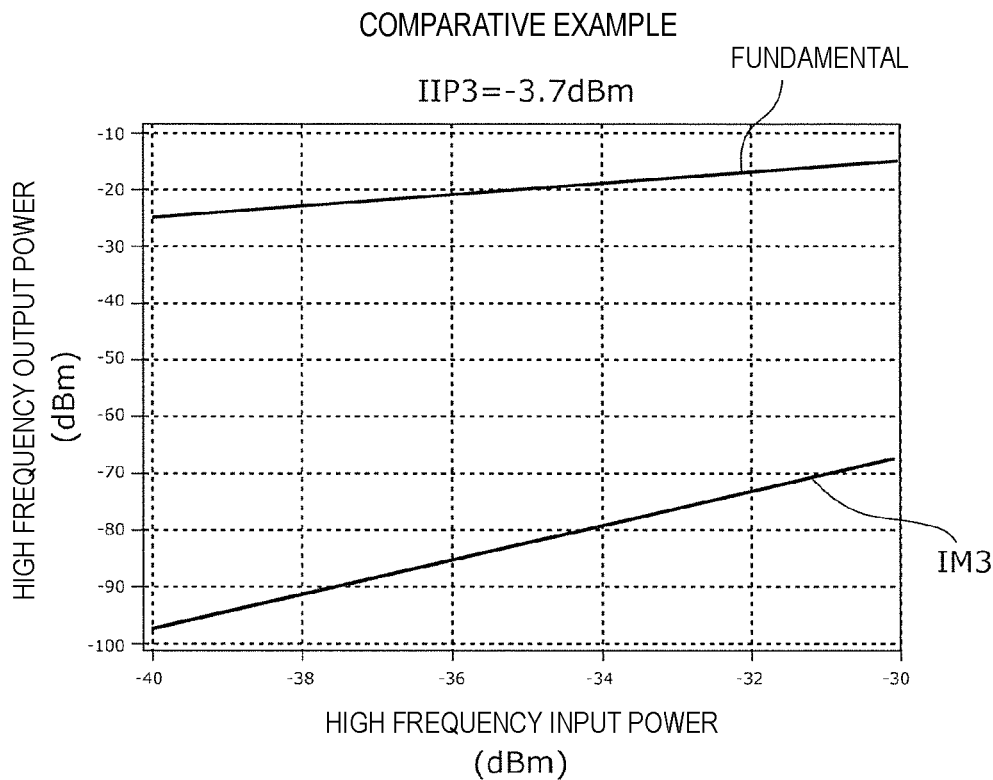
FIG. 3A is a graph illustrating the high frequency input power to high frequency output power characteristic of an amplifier circuit according to a comparative example.
Figure 3B:
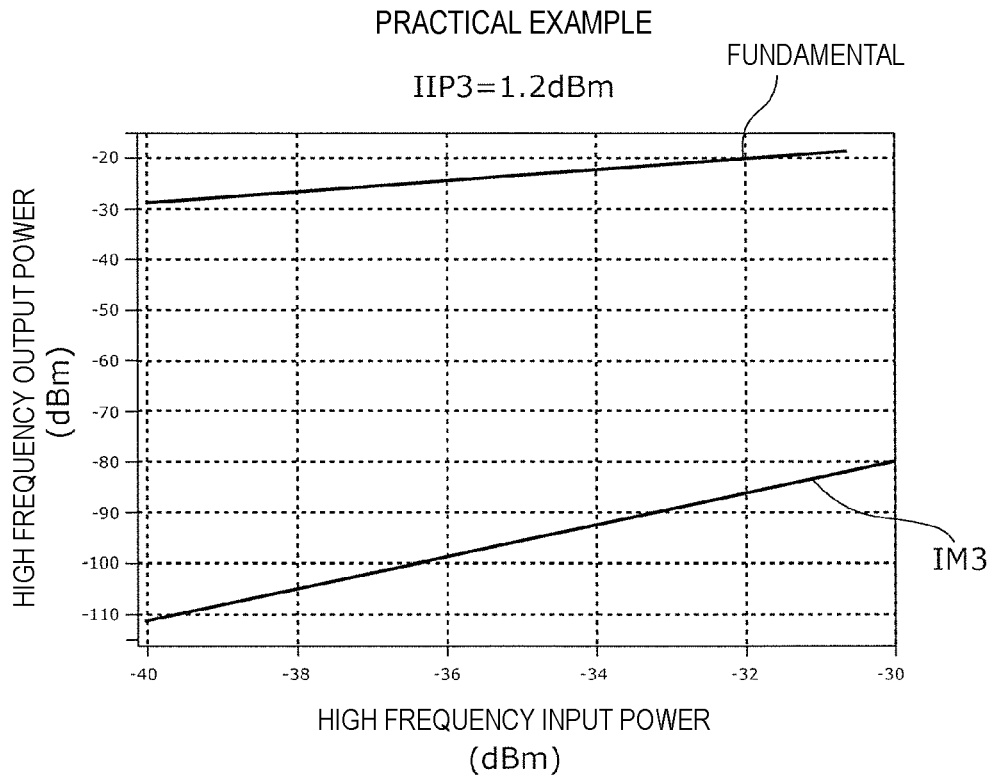
FIG. 3B is a graph illustrating the high frequency input power to high frequency output power characteristic of the amplifier circuit according to the practical example.

FIG. 3A is a graph illustrating the high frequency input power to high frequency output power characteristic of an amplifier circuit according to a comparative example. FIG. 3B is a graph illustrating the high frequency input power to high frequency output power characteristic of the amplifier circuit 1A according to the practical example. FIG. 3A illustrates the characteristic of the FET 20 of a small LW ratio+the inductor L2 while FIG. 3B illustrates the characteristic of the FET 20 of a small LW ratio+the inductor L2+the feedback circuit 21A.

In the present embodiment, when the FET 20 is of a small LW ratio, the LW ratio is, for example, 60. When the FET 20 is of a large LW ratio, the LW ratio is, for example, 600.

The amplifier circuit according to the comparative example differs from the amplifier circuit 1A according to the practical example in that the feedback circuit 21A is not provided.

As indicated in FIG. 3A, in the amplifier circuit according to the comparative example, the IIP3 (the point at which the fundamental and the third harmonic of the high frequency output power intersect relative to the high frequency input power) is −3.7 dBm. By contrast, as indicated in FIG. 3B, in the amplifier circuit 1A according to the practical example, the IIP3 is +1.2 dBm. This means that, as compared to the amplifier circuit according to the comparative example, the amplifier circuit 1A according to the practical example can reduce the third-order intermodulation distortion in the low-current and low-distortion mode in which the power intensity of high-frequency input signal is relatively high.

[1.4 Input Impedance Matching]

An input impedance Zin of a source-degeneration amplifier circuit in which an inductor is connected to the source terminal is given by the following Expression 3.

$$Z_{in} = \frac{gm \cdot L_s}{C_{gs}} + j\left[\omega(L_G + L_S) - \frac{1}{\omega C_{gs}}\right] \quad \text{(Expression 3)}$$

In Expression 3, gm is the transconductance of FET, Ls is the inductance value of an inductor coupled to a source terminal, Cgs is the capacitance value between the gate and the source of FET, LG is the inductance value of an impedance matching inductor coupled outside the amplifier circuit.

According to Expression 3, the imaginary part of the input impedance Zin can be made almost zero by the inductance value LG of the externally connected inductor. The real part of the input impedance Zin can be the characteristic impedance (for example, 50Ω) by gm, Ls, and Cgs.

In this case, since the LW ratio (W/L) of the FET 20 is smaller than the LW ratio (W/L) of the FET 10, Cgs is also smaller. In the amplifier circuit 1A according to the practical example, Ls in Expression 3 correspond to the inductor L1 with respect to the FET 10 and the inductor (L1+L3) with respect to the FET 20. For the purpose of reducing the third-order intermodulation distortion in the low-current and low-distortion mode, Ls of the FET 20 is set to be larger than Ls of the FET 10. In short, in comparison to the FET 10, Ls of the FET 20 is larger and Cgs is smaller. Hence, although the feedback circuits 22A can improve the distortion characteristic of the FET 20, input impedance matching between the FETs 10 and 20 according to Expression 3 is made difficult because the input impedance of the FET 20 is higher than the input impedance of the FET 10.

In this regard, when a feedback circuit formed as a CR series circuit is additionally provided between the drain terminal and the gate terminal of the FET amplification element, the input impedance Zin of the FET amplifier element is ideally given by Expression 4.

$$Z_{in} = \frac{R_F}{A_v} \quad \text{(Expression 4)}$$

In Expression 4, RF is the feedback resistance value and Av is the voltage gain. Accordingly, in the amplifier circuit 1A according to the practical example, as the resistance value of the resistance element R1 of the feedback circuit 21A decreases, the input impedance of the FET 20 decreases.

In the amplifier circuit 1A according to the practical example, the distortion characteristic of the FET 20 is improved by using the feedback circuits 22A (inductors L1+L3). As a result, according to Expression 3, the input impedance of the FET 20 is higher than the input impedance of the FET 10. To deal with this, according to Expression 4, the resistance value of the resistance element R1 is optimized by additionally providing the feedback circuit 21A for the FET 20, and as a result, the input impedance of the FET 20 can be lowered.

This means that, since the input impedance of the FET 20 can be adjusted by adjusting the resistance value of the resistance element R1 of the feedback circuit 21A, it is possible to achieve input impedance matching between the FETs 10 and 20.

The capacitor C1 of the feedback circuit 21A has a function of removing the DC component of feedback signal.

Figure 4A:
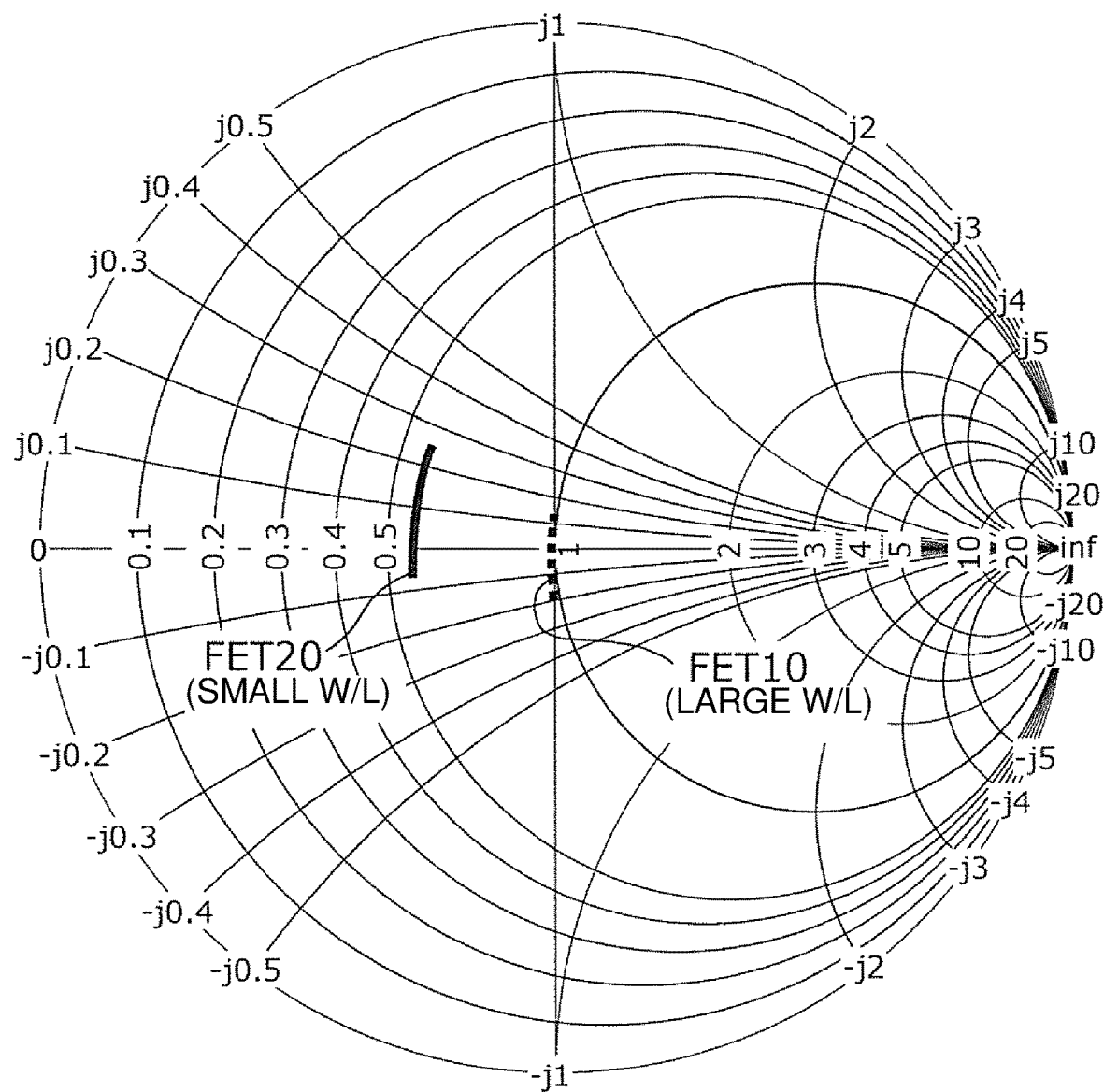
FIG. 4A is a Smith chart illustrating input impedances of a first transistor and a second transistor according to the comparative example.
Figure 4B:
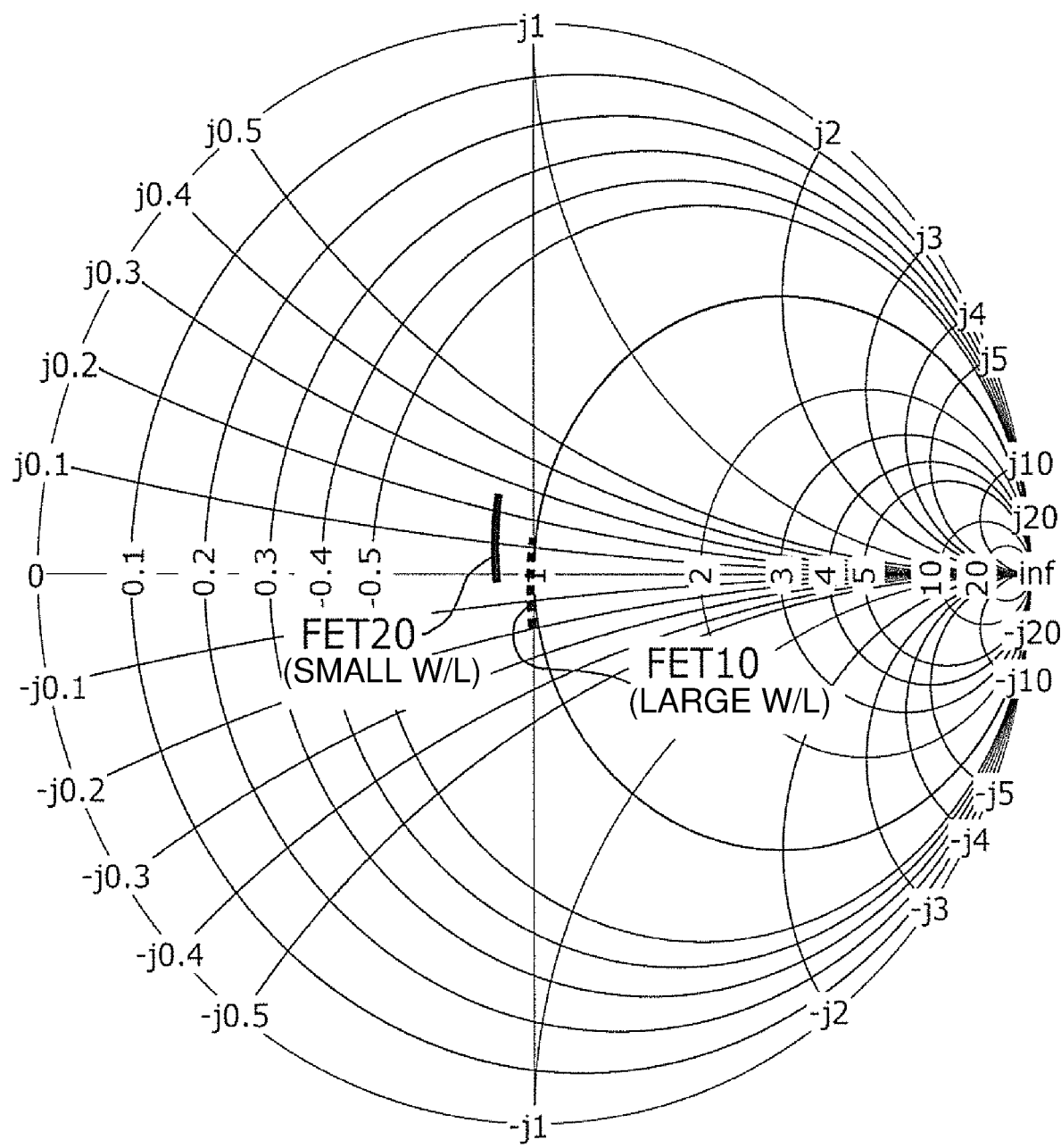
FIG. 4B is a Smith chart illustrating input impedances of a first transistor and a second transistor according to the practical example.

FIG. 4A is a Smith chart illustrating the input impedances of the FETs 10 and 20 according to the comparative example. FIG. 4B is a Smith chart illustrating the input impedances of the FETs 10 and 20 according to the practical example. Specifically, FIGS. 4A and 4B indicate the input impedance when the FET 10 is viewed from a node including an external matching inductor (inductance value: LG) coupled to the input terminal 100 and the input impedance when the FET 20 is viewed from the node. The dotted line in FIG. 4A indicates the input impedance of the FET 10 according to the comparative example and the solid line in FIG. 4A indicates the input impedance of the FET 20 according to the comparative example. The dotted line in FIG. 4B indicates the input impedance of the FET 10 according to the practical example and the solid line in FIG. 4B indicates the input impedance of the FET 20 according to the practical example. When FIGS. 4A and 4B are compared with each other, in the amplifier circuit 1A according to the practical example, the difference between the input impedance of the signal path of the FET 10 and the input impedance of the signal path of the FET 20 is smaller than that in the amplifier circuit according to the comparative example. Thus, in the amplifier circuit 1A according to the practical example, it is possible to achieve input impedance matching between (1) the high-gain and low-noise-figure mode and (2) the low-current and low-distortion mode.

Figure 5:
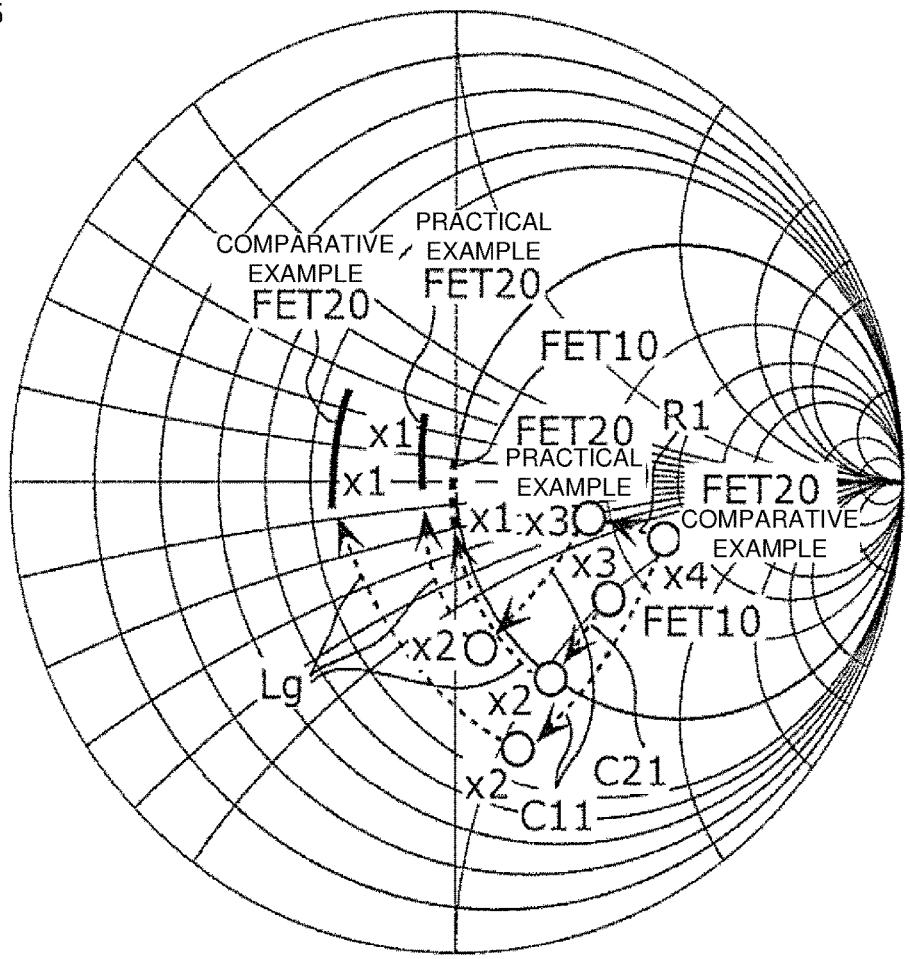
FIG. 5 provides a Smith chart in which nodes of the second transistor according to the practical example and the comparative example are compared to each other with respect to impedance.
Figure 5:
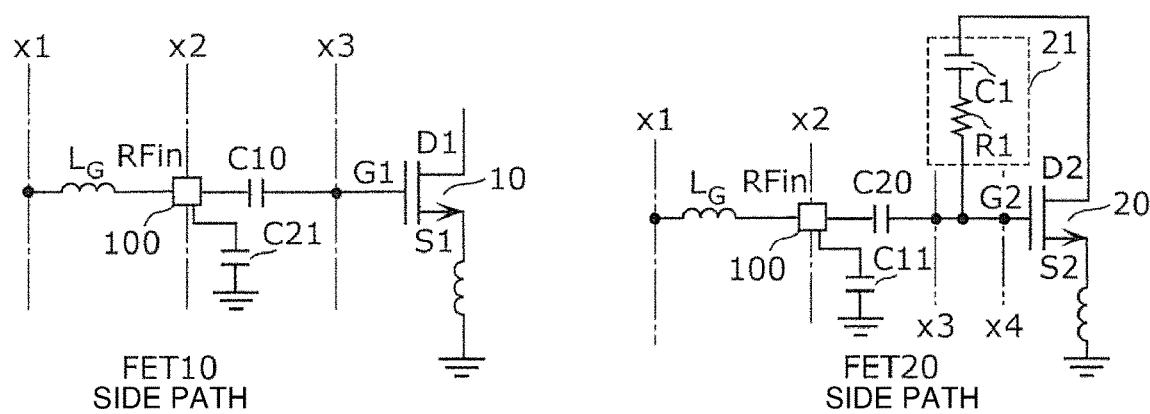

FIG. 5 provides a Smith chart in which nodes of the FET 20 according to the practical example and the comparative example are compared to each other with respect to impedance.

First, the input impedance when the FET 10 according to the practical example and the comparative example is viewed from a node x3 (gate terminal G1) is located at a position deviating from the characteristic impedance (50Ω) to the capacitive side in the Smith chart.

Next, the input impedance when the FET 20 according to the comparative example (without the feedback circuit 21A) is viewed from a node x4 (gate terminal G2) is located on the higher impedance side with respect to the input impedance when the FET 10 is viewed from the node x3. This is because, according to Expression 3, Cgs of the FET 20 is smaller than Cgs of the FET 10 and Ls (L1+L3) of the FET 20 is larger than Ls (L1) of the FET 10.

Next, the input impedance when the FET 20 according to the practical example (with the feedback circuit 21A) is viewed from the node x3 (gate terminal G2) is shifted to the lower impedance side with respect to the input impedance when the FET 20 according to the comparative example is viewed from the node x4. This is because, according to Expression 4, in comparison to the comparative example in which the FET 20 is in an open state (RF is infinite in Expression 4) between the drain and the gate, the input impedance is lower in the practical example in which the FET 20 is in a feedback state (RF is a finite value in Expression 4) between the drain and the gate.

Next, the FET 20 according to the practical example and the comparative example viewed from a node x2 is shifted to the capacitive side due to a capacitance C11 that is the off-capacitance of the FET 10 and that is deemed to be coupled between the input terminal 100 and the ground. At this time, as compared to the FET 20 according to the comparative example viewed from the node x3, the FET 20 according to the practical example viewed from the node x3 indicates a lower impedance and is situated closer to the characteristic impedance in the Smith chart (situated at a position closer to the center in the Smith chart). Thus, the FET 20 according to the practical example viewed from the node x3 indicates a smaller impedance shift amount due to the capacitor C11. This means that the FET 20 according to the practical example viewed from the node x2 is situated closer to the center of the Smith chart as compared to the FET 20 according to the comparative example viewed from the node x2.

Next, the FET 20 according to the practical example and the comparative example viewed from the node x2 is shifted on the constant resistance circle in the clockwise direction by the external matching inductor (inductance value: LG). At this time, as compared to the FET 20 according to the comparative example viewed from the node x2, the FET 20 according to the practical example viewed from the node x2 indicates a lower impedance and is situated closer to the characteristic impedance in the Smith chart (situated closer to the center in the Smith chart); and thus, the FET 20 according to the practical example viewed from the node x2 indicates a smaller impedance shift amount due to the external matching inductor.

As a result, the input impedance of the FET 20 according to the practical example viewed from the node x1 can be positioned closer to the input impedance of the FET 10 viewed from the node x1, as compared to the input impedance of the FET 20 according to the comparative example viewed from the node x1. Therefore, the amplifier circuit 1A according to the practical example can match the input impedance of the FET 20 with the impedance of the FET 10 of a lower impedance.

As described above, the impedance when the FET 20 to which the feedback circuit 21A is coupled is viewed from the gate terminal G2 (node x3) of the FET 20 is situated closer to the center in the Smith chart, as compared to the impedance when the FET 20 alone to which the feedback circuit 21A is not coupled is viewed from the gate terminal G2 (node x3).

This means that, by providing the feedback circuit 21A, the input impedance of the FET 20 can be brought closer to the center in the Smith chart, and accordingly, it is possible to reduce the movement of the input impedance due to the off-capacitance of the FET 10. As a result, as compared to the input impedance of the FET 20 of a high impedance without necessarily the feedback circuit 21A, the input impedance of the FET 20 with the feedback circuit 21A can be lowered. Consequently, the input impedance of the FET 20 can be matched with the impedance of the FET 10 of a low impedance.

[1.5 Output Impedance Matching]

Figure 6:
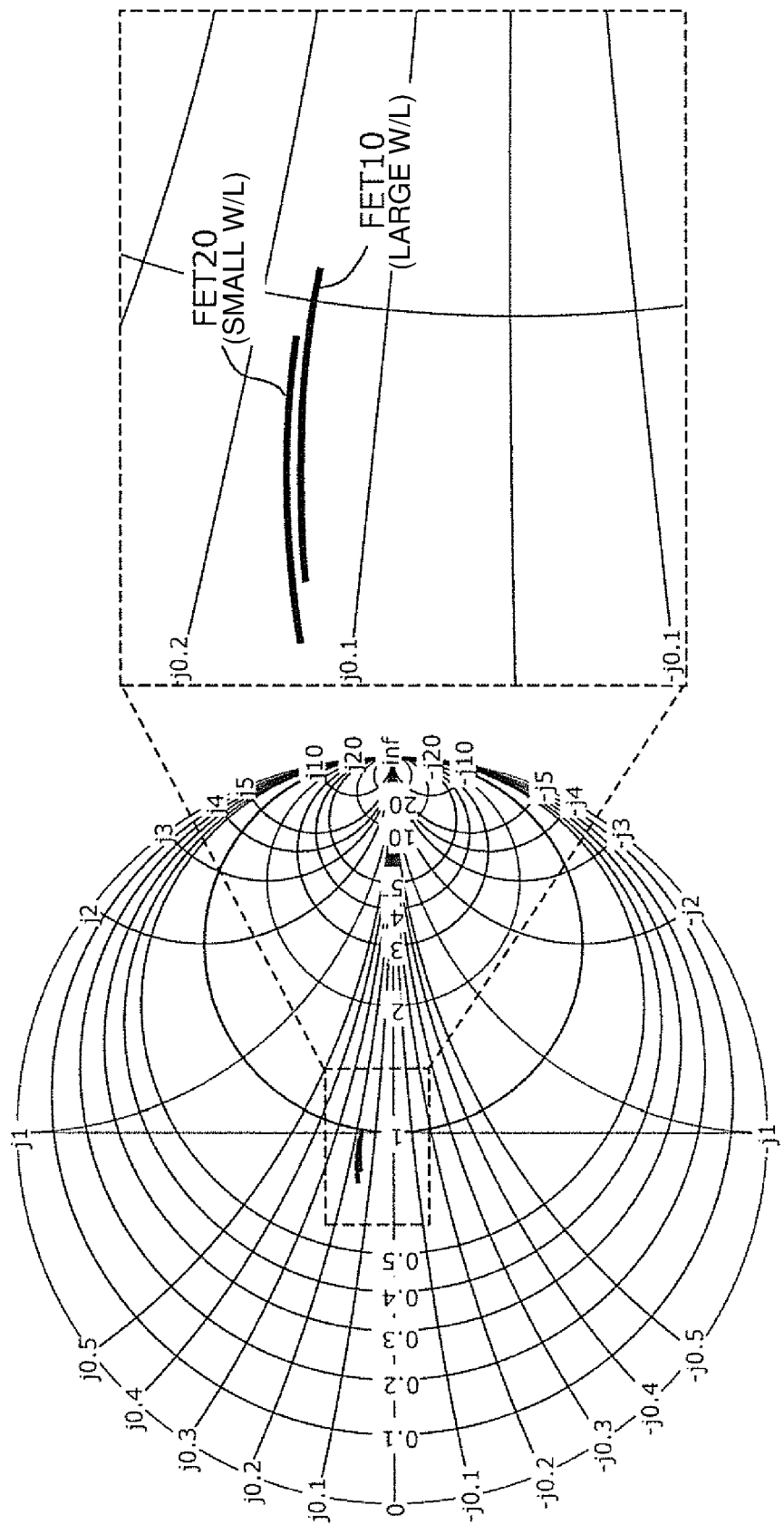
FIG. 6 provides a Smith chart illustrating output impedances of the first transistor and the second transistor according to the practical example.

FIG. 6 provides a Smith chart illustrating the output impedances of the FETs 10 and 20 according to the practical example. The chart illustrates the output impedance (indicated by FET 10 in FIG. 6) when the FET 30 is viewed from the output terminal 200 and the output impedance (indicated by FET 20 in FIG. 6) when the FETs 20 and 30 are viewed from the output terminal 200. As illustrated in FIG. 6, in the amplifier circuit 1A according to the practical example, the difference between the output impedance of the signal path of the FET 10 and the output impedance of the signal path of the FET 20 is small, and thus, output impedance matching can be achieved between (1) the high-gain and low-noise-figure mode and (2) the low-current and low-distortion mode.

This output impedance matching can be accomplished because the FET 30 is commonly cascoded with both the output side of the FET 10 and the output side of the FET 20 in the amplifier circuit 1A according to the practical example.

It should be noted that the FET cascoded with the FETs 10 and 20 is not necessarily the common FET 30 but may be, for example, two FETs respectively cascoded with the FETs 10 and 20. In this case, it is desirable that the FET cascoded with the output side of the FET 10 and the FET cascoded with the output side of the FET 20 indicate an identical LW ratio (W/L). This makes it possible to match the output impedance of the signal path of the FET 10 with the output impedance of the signal path of the FET 20.

[1.6 Amplifier Circuit According to Second Modified Example]

Figure 7:
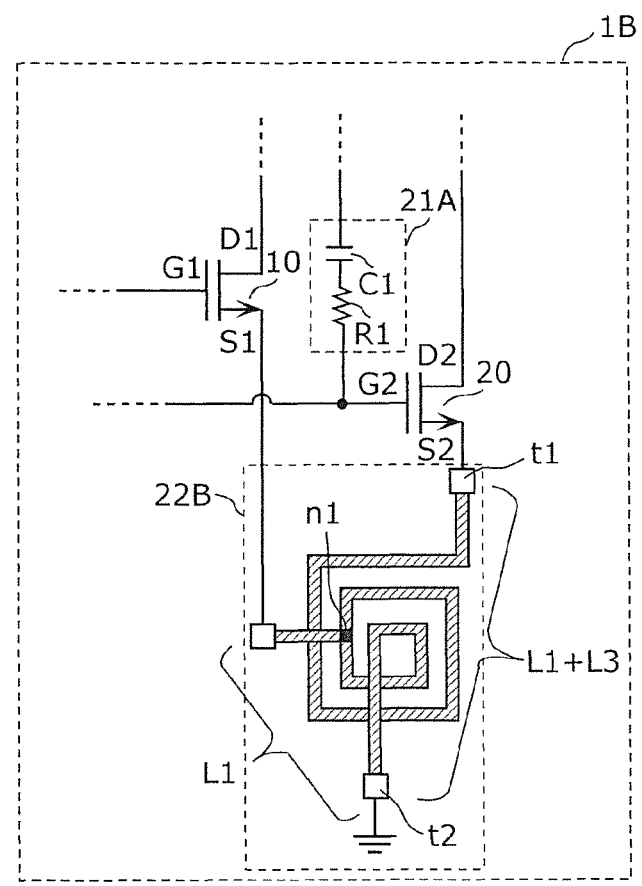
FIG. 7 is a circuit configuration diagram of an amplifier circuit according to a second modified example.

FIG. 7 is a circuit configuration diagram of an amplifier circuit 1B according to a second modified example. The drawing illustrates a partial configuration of the amplifier circuit 1B according to the second modified example. The amplifier circuit 1B according to this modified example differs from the amplifier circuit 1A according to the practical example in only the configuration of a feedback circuit 22B. Hereinafter, concerning the amplifier circuit 1B according to this modified example, description of configurations identical to the configurations of the amplifier circuit 1A according to the practical example is omitted and different configurations are mainly described.

The amplifier circuit 1B includes the input terminal 100 (not illustrated in the drawing), the output terminal 200 (not illustrated in the drawing), the FETs 10, 20, and 30, and the feedback circuits 21A and 22B. The amplifier circuit 1B further includes the capacitors C10, C20, and C30 (not illustrated in the drawing), the resistance elements R21, R22, and R23 (not illustrated in the drawing), and the output matching circuit 31 (not illustrated in the drawing).

The feedback circuit 22B is a circuit for feeding back to the gate terminal G2 of the FET 20 a high frequency signal outputted from the source terminal S2 of the FET 20 and includes the inductors L1 and L3. The circuit configuration of the feedback circuit 22B is the same as the circuit configuration of the feedback circuit 22A, but the feedback circuit 22B according to this modified example indicates a specific mounting configuration of the inductors L1 and L3.

The inductor (L1+L3) coupled to the source terminal S2 of the FET 20 is formed to include a wiring between one end t1 and another end t2 of one winding formed on one or more planes. As for the inductors L1 and L3, the inductor L3 is formed to include a wiring between a node n1 in some midpoint of the winding and the one end t1; the inductor L1 is formed to include a wiring between the node n1 and the other end t2. The inductor L1 may be formed by using a wiring connecting the node n1 and the source terminal S1 of the FET 10 in addition to the winding wire between the node n1 and the other end t2. The inductor (L1+L3) may be formed by using a wiring connecting the one end t1 and the source terminal S2 of the FET 20 in addition to the winding between the one end t1 and the other end t2. The inductor L3 may be formed by using a wiring connecting the one end t1 and the source terminal S2 of the FET 20 in addition to the winding between the one end t1 and the node n1.

As such, at least a part of the inductor L1 and the inductor L3 can be formed by one winding instead of two windings, and as a result, this contributes to downsizing of the amplifier circuit 1B.

Moreover, as an amplifier circuit according to another modified example, a switching circuit for switching between connection and disconnection between the input terminal 100 and the FET 20 (the gate terminal G2) may be inserted in a signal path connecting the input terminal 100 and the capacitor C20 in the amplifier circuit 1A according to the practical example.

Figure 8:
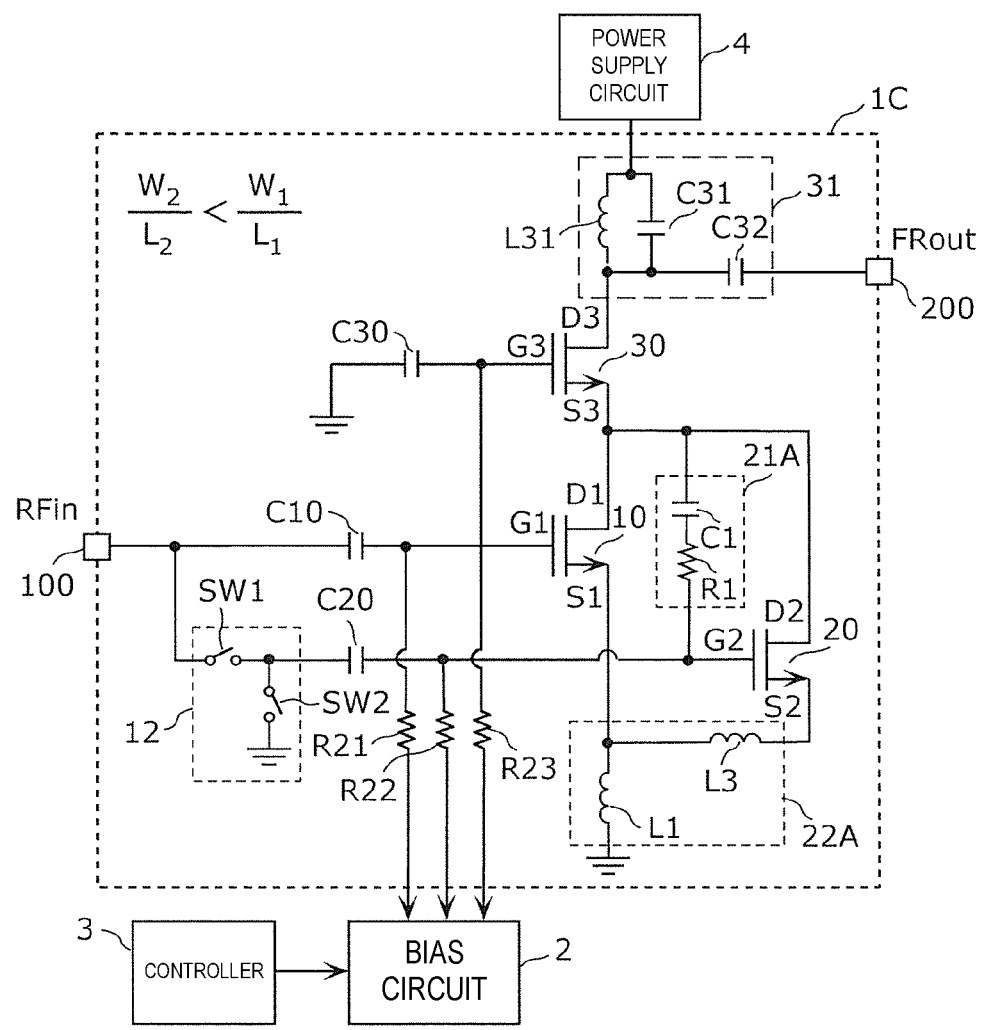
FIG. 8 is a circuit configuration diagram of an amplifier circuit according to the third modified example and peripheral circuits.

FIG. 8 is a circuit configuration diagram of the amplifier circuit 1C according to a third modified example and peripheral circuits. In the drawing, the amplifier circuit 1A according to this modified example, the bias circuit 2, the controller 3, and the power supply circuit 4 are illustrated. The amplifier circuit 1C according to this modified example differs from the amplifier circuit 1A according to the practical example only in that a switching circuit 12 is added in a path connecting the input terminal 100 and the capacitor C20. Hereinafter, concerning the amplifier circuit 1C according to this modified example, description of configurations identical to the configurations of the amplifier circuit 1A according to the practical example is omitted and different configurations are mainly described.

The switching circuit 12 is constituted by, for example, a single-pole single-throw (SPST) switch SW1 positioned in series in the path connecting the input terminal 100 and the capacitor C20 and a switch SW2 positioned between a connection point of the switch SW1 and the capacitor C20 and the ground.

With this configuration, (1) when the power intensity of high-frequency input signal is relatively high, the FET 20 is caused to operate by setting the switch SW1 to a connected state and the switch SW2 to a disconnected state; (2) when the power intensity of high-frequency input signal is relatively low, the FET 10 is caused to operate by setting the switch SW1 to a disconnected state and the switch SW2 to a connected state. With this configuration, the switching circuit 12 is not provided in the signal path in which the FET 10 is provided, and thus, it is possible to suppress deterioration of the noise figure of the FET 10 due to switch loss.

Furthermore, when the FET 10 is in operation, by setting the switch SW1 to a disconnected state and the switch SW2 to a connected state, it is possible to prevent the FET 20 from acting as an off-capacitance.

Other Embodiments

While the amplifier circuit according to the embodiment has been described by using the practical example and modified examples, the amplifier circuit of the present disclosure is not limited to the embodiment described above. The present disclosure also embraces other embodiments implemented as any combination of the constituent elements of the embodiment, other modified examples obtained by making various modifications to the embodiment that occur to those skilled in the art without necessarily departing from the scope of the present disclosure, and various hardware devices including the amplifier circuit according to the present disclosure.

The FETs 10 and 20 according to the embodiment are used as, for example, low noise amplifier elements (LNAs). As such, it is possible to provide a low noise amplifier circuit with an improved noise figure and an improved distortion characteristic.

Furthermore, the amplifier circuit 1 according to the embodiment and the amplifier circuit 1A according to the practical example may include the bias circuit 2 and the controller 3.

It should be noted that, in the amplifier circuits according to the embodiment, practical example, and modified examples described above, another high-frequency circuit element or another wiring may be inserted in a path connecting the circuit elements and the signal paths that are illustrated in the drawings.

INDUSTRIAL APPLICABILITY

The present disclosure can be widely used in communication devices as a cascode-connected amplifier circuit for amplifying high frequency signals.

REFERENCE SIGNS LIST 1, 1A, 1B, 1C amplifier circuit
2 bias circuit
3 controller
4 power supply circuit
10, 20, 30 FET
12 switching circuit
21, 21A, 22, 22A, 22B feedback circuit
31 output matching circuit
100 input terminal
200 output terminal
C1, C10, C20, C30, C31, C32 capacitor
C11, C21 capacitance
D1, D2, D3 drain terminal
G1, G2, G3 gate terminal
L1, L2, L3, L31 inductor
R1, R21, R22, R23 resistance element
S1, S2, S3 source terminal
SW1, SW2, SW3 switch

The invention claimed is:
1. An amplifier circuit comprising:
an input terminal to which a high frequency signal is input;
an output terminal configured to output an amplified high frequency signal;

a first transistor having a first source terminal, a first drain terminal, and a first gate terminal, the high frequency signal being input to the first gate terminal via the input terminal;

a second transistor having a second source terminal, a second drain terminal, and a second gate terminal, the high frequency signal being input to the second gate terminal via the input terminal, and the second transistor being coupled in parallel with the first transistor;

a third transistor having a third source terminal coupled to the first drain terminal or the second drain terminal, a third drain terminal configured to output the amplified high frequency signal, and a third gate terminal that is grounded, the third transistor being cascode connected with the first transistor or the second transistor; and a feedback circuit configured to feed back the high frequency signal output from the second source terminal or the second drain terminal to the second gate terminal, wherein a ratio of a gate width of the second transistor W2 to a gate length of the second transistor L2 (W2/L2) is less than a ratio of a gate width of the first transistor W1 to a gate length of the first transistor L1 (W1/L1).

2. The amplifier circuit according to claim 1, wherein the feedback circuit is between the second drain terminal and the second gate terminal, and comprises a resistance element coupled in series with a capacitive element.

3. The amplifier circuit according to claim 2, wherein, as seen in a Smith chart, an impedance viewed from the second gate terminal of the second transistor and including the feedback circuit is closer to a center of the Smith chart than an impedance viewed from the second gate terminal without the feedback circuit.

4. The amplifier circuit according to claim 1, further comprising:
a first inductor in series between the first source terminal of the first transistor and ground; and
a second inductor in series between the second source terminal of the second transistor and ground,
wherein the feedback circuit comprises the second inductor.

5. The amplifier circuit according to claim 4, wherein an inductance value of the second inductor is greater than an inductance value of the first inductor.

6. The amplifier circuit according to claim 1, further comprising:
a first inductor in series between the first source terminal of the first transistor and ground; and
a third inductor in series between the second source terminal of the second transistor and the first inductor,
wherein the feedback circuit comprises the first inductor and the third inductor.

7. The amplifier circuit according to claim 6, wherein:
the first inductor and the third inductor comprise a wiring winding in one or more planes,
the third inductor comprises a first portion of the wiring winding,
the first inductor comprises a second portion of the wiring winding,
the first portion of the wiring winding does not comprise any of the second portion of the wiring winding.

8. The amplifier circuit according to claim 1, further comprising:
a first capacitor in series between the input terminal and the first gate terminal; and
a second capacitor in series between the input terminal and the second gate terminal.

9. The amplifier circuit according to claim 1, further comprising:
a switch circuit in a path, the path connecting the input terminal and the second gate terminal, the switch circuit being configured to selectively connect the input terminal and the second gate terminal.

10. The amplifier circuit according to claim 1, wherein the first transistor and the second transistor are low noise amplifier elements.

11. The amplifier circuit according to claim 1, further comprising:
a bias circuit configured to supply a direct current (DC) bias voltage to the first gate terminal of the first transistor, the second gate terminal of the second transistor, and the third gate terminal of the third transistor; and
a controller configured to control the first transistor and the second transistor to perform an amplification operation on the high frequency signal in an exclusive manner by adjusting the DC bias voltage supplied from the bias circuit in accordance with a power intensity of the high frequency signal input to the input terminal.

12. The amplifier circuit according to claim 1, further comprising:
a switch coupled in series between the feedback circuit and the second gate terminal of the second transistor.

13. The amplifier circuit according to claim 12, wherein the switch is configured to be in a connected state when the second transistor performs an amplification operation and is configured to be in a disconnected state when the first transistor performs the amplification operation.

* * * * *